(12) United States Patent
Seh et al.

(10) Patent No.: US 8,143,697 B2
(45) Date of Patent: Mar. 27, 2012

(54) METHOD, APPARATUS, AND SYSTEM FOR LOW TEMPERATURE DEPOSITION AND IRRADIATION ANNEALING OF THIN FILM CAPACITOR

(75) Inventors: Huankiat Seh, Phoenix, AZ (US); Yongki Min, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 147 days.

(21) Appl. No.: 12/501,306

(22) Filed: Jul. 10, 2009

(65) Prior Publication Data

US 2009/0273057 A1   Nov. 5, 2009

Related U.S. Application Data

(62) Division of application No. 11/427,532, filed on Jun. 29, 2006, now Pat. No. 7,572,709.

(51) Int. Cl.
*H01L 23/522* (2006.01)
*H05K 1/16* (2006.01)

(52) U.S. Cl. ......... 257/532; 257/E27.048; 257/E23.144; 361/306.2; 361/301.2; 361/739; 361/750

(58) Field of Classification Search ............ 257/532, 257/924, E27.048, E29.343, E23.144; 361/306.2, 361/301.2, 301.4, 736, 739, 750
See application file for complete search history.

(56) References Cited

U.S. PATENT DOCUMENTS

| | | | |
|---|---|---|---|
| 5,079,069 A * | 1/1992 | Howard et al. | 428/209 |
| 5,161,086 A * | 11/1992 | Howard et al. | 361/321.1 |
| 5,172,304 A * | 12/1992 | Ozawa et al. | 361/763 |
| 5,261,153 A * | 11/1993 | Lucas | 29/830 |
| 5,745,334 A * | 4/1998 | Hoffarth et al. | 361/313 |
| 5,841,686 A * | 11/1998 | Chu et al. | 365/51 |
| 5,939,744 A * | 8/1999 | Horikawa et al. | 257/297 |
| 5,996,880 A * | 12/1999 | Chu et al. | 228/180.21 |
| 6,049,103 A * | 4/2000 | Horikawa et al. | 257/303 |
| 6,130,124 A | 10/2000 | Lee | |
| 6,218,729 B1 * | 4/2001 | Zavrel et al. | 257/698 |
| 6,326,258 B1 | 12/2001 | Iizuka | |
| 6,326,316 B1 | 12/2001 | Kiyotoshi et al. | |
| 6,477,034 B1 | 11/2002 | Chakravorty et al. | |
| 6,678,144 B2 * | 1/2004 | Higashi et al. | 361/306.3 |

(Continued)

FOREIGN PATENT DOCUMENTS

JP   2005108885 A   *   4/2005

(Continued)

OTHER PUBLICATIONS

"International Application No. PCT/2007/064275 PCT Search Report", (Sep. 4, 2007), 5 pgs.

(Continued)

*Primary Examiner* — David Vu
*Assistant Examiner* — Earl Taylor
(74) *Attorney, Agent, or Firm* — Schwegman, Lundberg & Woessner, P.A.

(57) ABSTRACT

Some embodiments of the invention include thin film capacitors formed in a package substrate of an integrated circuit package. At least one of the thin film capacitors includes a first electrode layer, a second electrode layer, and a dielectric layer between the first and second electrode layers. Each of the first and second electrode layers and the dielectric layer is formed individually and directly on the package substrate. Other embodiments are described and claimed.

13 Claims, 15 Drawing Sheets

U.S. PATENT DOCUMENTS

| | | | |
|---|---|---|---|
| 6,829,133 | B2 | 12/2004 | Wermer et al. |
| 6,852,416 | B2 | 2/2005 | Zhang et al. |
| 6,955,925 | B1 | 10/2005 | Donohue et al. |
| 7,002,075 | B2* | 2/2006 | Kambe et al. ............... 174/565 |
| 7,025,607 | B1 | 4/2006 | Das et al. |
| 7,572,709 | B2 | 8/2009 | Seh et al. |
| 7,613,007 | B2* | 11/2009 | Amey et al. ............... 361/763 |
| 7,621,041 | B2* | 11/2009 | Banerji et al. ............... 29/832 |
| 2002/0033378 | A1* | 3/2002 | Hayashi et al. ............... 216/11 |
| 2002/0134581 | A1 | 9/2002 | Figueroa |
| 2004/0018693 | A1 | 1/2004 | Shioga et al. |
| 2004/0147139 | A1 | 7/2004 | Jiang |
| 2004/0231885 | A1* | 11/2004 | Borland et al. ............... 174/260 |
| 2005/0007723 | A1 | 1/2005 | Mosley |
| 2005/0094452 | A1 | 5/2005 | Lee et al. |
| 2005/0207091 | A1* | 9/2005 | Kambe et al. ............... 361/301.1 |
| 2006/0000542 | A1 | 1/2006 | Palanduz et al. |
| 2006/0007723 | A1 | 1/2006 | Aoki et al. |
| 2006/0091495 | A1 | 5/2006 | Palanduz et al. |
| 2006/0097246 | A1 | 5/2006 | Palanduz et al. |
| 2006/0099803 | A1 | 5/2006 | Min |
| 2006/0138591 | A1* | 6/2006 | Amey et al. ............... 257/532 |
| 2006/0158828 | A1* | 7/2006 | Amey et al. ............... 361/311 |
| 2006/0220167 | A1* | 10/2006 | Min et al. ............... 257/499 |
| 2006/0228855 | A1 | 10/2006 | Min et al. |
| 2006/0281278 | A1 | 12/2006 | Min |
| 2006/0283547 | A1* | 12/2006 | Yuri et al. ............... 156/308.6 |
| 2006/0289976 | A1 | 12/2006 | Min |
| 2007/0001259 | A1* | 1/2007 | Palanduz ............... 257/532 |
| 2007/0006435 | A1* | 1/2007 | Banerji et al. ............... 29/25.41 |
| 2007/0222030 | A1 | 9/2007 | Salama et al. |
| 2008/0003765 | A1 | 1/2008 | Seh et al. |
| 2008/0145622 | A1 | 6/2008 | Roy et al. |
| 2008/0289866 | A1* | 11/2008 | Yuri et al. ............... 174/260 |
| 2009/0273057 | A1* | 11/2009 | Seh et al. ............... 257/532 |

FOREIGN PATENT DOCUMENTS

WO   WO-2007117873 A1   10/2007

OTHER PUBLICATIONS

"International Application No. PCT/2007/064275 PCT Written Opinion", (Sep. 4, 2007), 6 pgs.

Achar, B. N., et al., "Phthalocyanine Polymers. II Synthesis and Characterization of Some Metal Phthalocyanine Sheet Oligomers.", *J. Polym. Sci. Polym. Chem.*, 20, (1982), 1785-1790.

Matsumoto, T., et al., "Low temperature preparation of perovskite oxide films by ECR sputtering assisted with microwave treatment", *Surface and Coatings Technology*, 174-175, (Sep.-Oct. 2003), 611-614.

Min, Y., et al., "Capacitor With Co-Planar Electrodes", U.S. Appl. No. 11/092,357, filed Mar. 29, 2005.

Min, Y., et al., "IC Package With Prefabricated Film Capacitor", U.S. Appl. No. 11/095,690, filed Mar. 31, 2005.

Min, Y., et al., "Integrated Thin Film Capacitors With Adhesion Holes for Improvement of Adhesion Strength", U.S. Appl. No. 11/304,649, filed Dec. 14, 2005.

Min, Y., "Integrated Thin-Film Capacitor With Etch-Stop Layer, Process of Making Same, and Packages Containing Same", U.S. Appl. No. 11/152 328, filed Jun. 14 2005.

Min, Y., "Method of Providing a VIA Opening in a Dielectric Film of a Thin Film of a Thin Film Capacitor", U.S. Appl. No. 11/297,854, filed Dec. 8, 2005.

Min, Y., "Pre-Patterned Thin Film Capacitor and Method for Embedding Same in a Package Substrate", U.S. Appl. No. 11/166,962, filed Jun. 23, 2005.

Salama, I. A., et al., "Low Temperature Deposition and Ultra Fast Annealing of Integrated Circuit Thin Film Capacitor", U.S. Appl. No. 11/277,606, filed Mar. 27, 2006.

Seh, H., et al., "Inkjet Patterning for Thin-Film Capacitor Fabrication, Thin-Film Capacitors Fabricated Thereby, and Systems Containing Same", U.S. Appl. No. 11/396,394, filed Mar. 31, 2006.

Seh, H., et al., "Sol-Gel and Mask Patterning for Thin-Film Capacitor Fabrication, Thin-Film Capacitors Fabricated Thereby, and Systems Containing Same", U.S. Appl. No. 11/396,386, filed Mar. 31, 2006.

Zhang, Q. M., et al., "An All-organic Composite Actuator Material With a High Dielectric Constant", *Nature*, 419(6904), (Sep. 19, 2002), 284-287.

"U.S. Appl. No. 11/610,601, Final Office Action mailed Jan. 6, 2010", 17 pgs.

* cited by examiner

METHOD, APPARATUS, AND SYSTEM FOR LOW TEMPERATURE DEPOSITION AND IRRADIATION ANNEALING OF THIN FILM CAPACITOR

RELATED APPLICATION

This application is a divisional of U.S. application Ser. No. 11/427,532, filed Jun. 29, 2006 now U.S. Pat. No. 7,572,709, which is incorporated herein its entirety by reference.

FIELD

Embodiments of the present invention relate to integrated circuit packaging, and particularly to capacitors in integrated circuit packages.

BACKGROUND

Computers and electronic devices usually include an integrated circuit package. The package may often have a die mounted on a base or substrate of the package. The die may include an integrated circuit for performing an electrical function. The package may also have one or more capacitors formed on the substrate. The capacitors may be used in various ways based on the function of the integrated circuit. The capacitor may be formed from multiple layers of thin films of conductive material and dielectric material.

In some conventional techniques, the capacitor is pre-formed in a separate process, then the entire pre-formed capacitor is mounted or laminated onto the substrate of the package in another separate process. The process of mounting the pre-formed capacitor onto a substrate in the conventional techniques is often called capacitor-to-substrate lamination process.

Forming the capacitor in a package using the conventional techniques with the lamination process may involve both a careful handling of the thin films of the pre-formed capacitor before the lamination and a high degree of alignment accuracy during the lamination. Some of these conventional techniques may also be expensive and time consuming.

DESCRIPTION OF EMBODIMENTS

Figure 1:
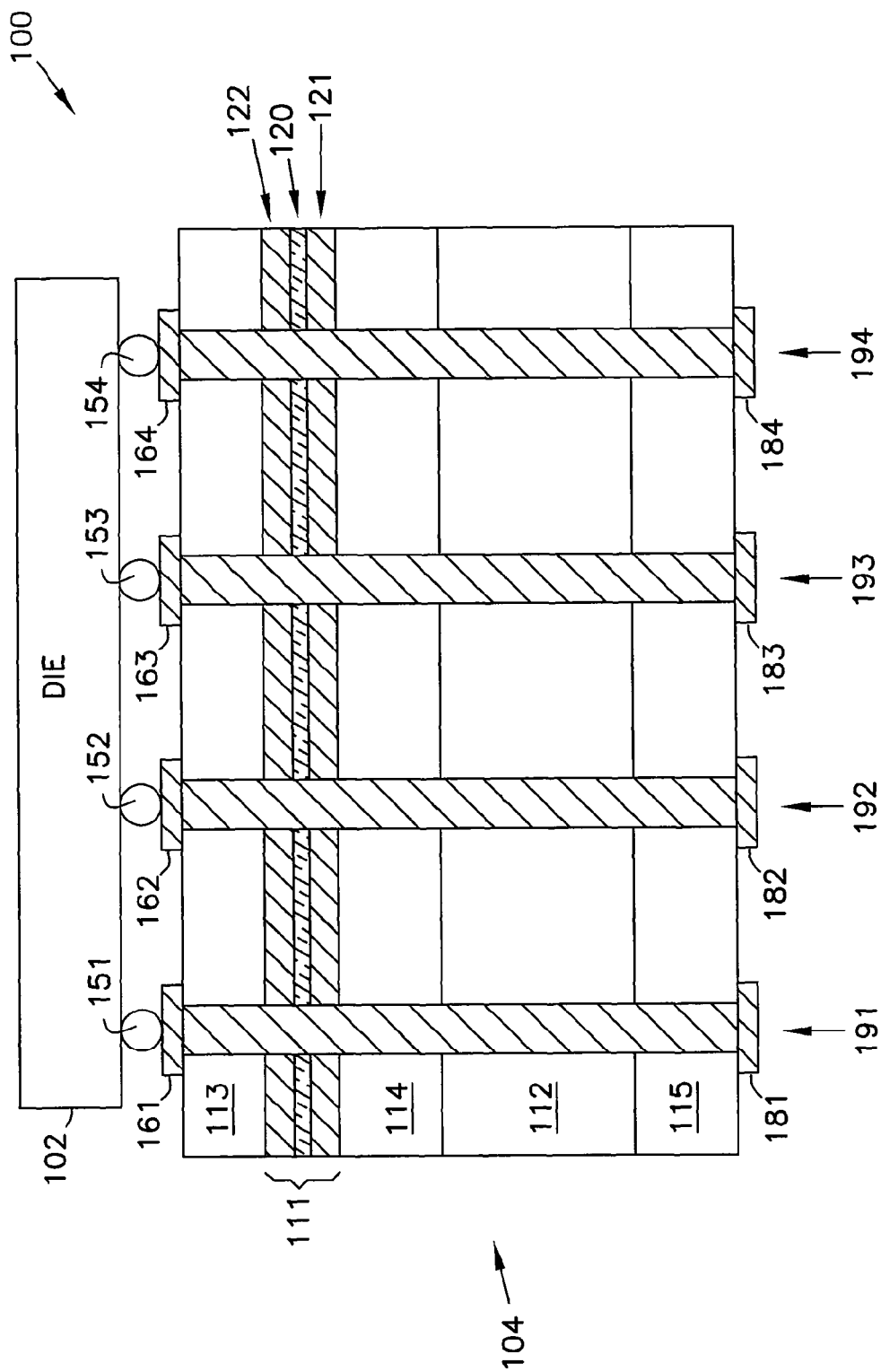
FIG. 1 shows an apparatus having a thin film capacitor (TFC) according to an embodiment of the invention.

FIG. 1 shows a package 100 according to an embodiment of the invention. Package 100 may be an integrated circuit package. Package 100 includes a die 102 attached to a substrate 104. Substrate 104 may be called a package substrate. Die 102 may include one or more integrated circuits. In some embodiments, die 102 may include an integrated circuit to perform a function of a processor, a communication device, a memory device, or some combination thereof. Die 102 may include integrated circuits to perform other functions. In some embodiments, package 100 resides in a system or in a device such a computer or a communication device (e.g., a cellular phone).

Package 100 includes conductive contacts or pads 161, 162, 163, and 164 on one side of substrate 104 and conductive contacts or pads 181, 182, 183, and 184 on another side of substrate 104. Package 100 also includes conductive paths or interconnects 191, 192, 193, and 194 extending between contacts 161 through 164 and contacts 181 through 184. Die 102 couples to substrate 104 through conductive elements, for example, through solder balls 151, 152, 153, and 154.

In a system or a device, for example, a computer or a wireless communication device, conductive contacts 181 through 184 may be coupled to a platform such as a circuit board (not shown) to allow die 102 to exchange information or data with other components through conductive paths 191, 192, 193, and 194. A group of the conductive paths 191 through 194 may be coupled to power terminals as positive and ground terminals of a power source. Another group of the conductive paths 191 through 194 may be coupled to other components of the system or device to transfer data. FIG. 1 shows package 100 with four conductive paths, 191 through 194, for example purposes. The number of conductive paths of package 100 may vary. For example, package 100 may include numerous conductive paths forming a high-density interconnect arrangement.

Substrate 104 includes a core layer 112, and buildup layers 113, 114, and 115. Core layer 112 may include organic material. Buildup layers 113, 114, and 115 may include organic material. In some embodiments, one or more of the buildup layers 113, 114, and 115 may include a polymer material or an Ajinomoto buildup film (ABF).

A number of thin film capacitors 111 are formed and are embedded in substrate 104. As shown in FIG. 1, thin film capacitors 111 are embedded in substrate 104 between buildup layer 113 and other layers of substrate 104. Thin film capacitors 111 are referred to as integrated thin film capacitors. For clarity, FIG. 1 shows a high-level diagram of thin film capacitors 111. Detail formation of some embodiments of thin film capacitors 111 are shown in FIG. 2 through FIG. 8. In the description herein, thin film capacitors (TFC) 111 are collectively called TFC 111. The term TFC, such as TFC 111, refers to either a single thin film capacitor or a group of multiple thin film capacitors. In FIG. 1, TFC 111 may be used in different ways. For example, one or more of the TFC 111 may be used as filtering capacitors or coupling capacitors in a signal filtering or power distribution circuitry.

TFC 111 includes conductive layers or capacitor electrode layers 121 and 122, and a dielectric layer 120. Conductive layers 121 and 122 may include copper, nickel, or other conductive materials. In some embodiments, at least one of the conductive layers 121 and 122 may be a foil or thin film with a thickness of about 10 micrometers. In other embodiments, at least one of the conductive layers 121 and 122 may be a thin film with a thickness of about 30 micrometers. In some other embodiments, at least one of the conductive layers 121 and 122 may be a thin film with a thickness between about 10 micrometers and about 30 micrometers.

Dielectric layer 120 may include a high dielectric constant (high k) material. In some embodiments, dielectric layer 120 may be formed by depositing a dielectric material at a relatively low temperature on conductive layer 121, then annealing dielectric layer 120 with electromagnetic irradiation. In some embodiments, dielectric layer 120 may have a dielectric constant of about 400. In other embodiments, dielectric layer 120 may have a dielectric constant of about 6000. In some other embodiments, dielectric layer 120 may have a dielectric constant between about 400 and about 6000. Dielectric layer 120 may include a ceramic material. Some examples of materials of dielectric layer 120 include barium titanate $BaTiO_3$, strontium titanate $SrTiO_3$, and barium strontium titanate $BaSrTiO_3$. In some embodiments, dielectric layer 120 has a thickness of about one micrometer.

In FIG. 1, each of the components of TFC 111, such as conductive layers 121 and 122, and dielectric layer 120, is formed directly on and embedded in substrate 104 without a lamination process such that none of the portions or components of TFC 111 is pre-formed and then laminated onto substrate 104.

In some embodiments, TFC 111 may be formed in an in-situ process such that each of the components of TFC 111 is formed individually and directly on one or more layers of substrate 104. For example, in the in-situ process, conductive layer 121 may be formed directly on core layer 112, and buildup layers 114 and 115. In the in-situ process, dielectric layer 120 may be formed directly on conductive layer 121 and then annealed while dielectric layer 120 is over conductive layer 121, core layer 112, and buildup layers 114 and 115. In the in-situ process, conductive layer 122 may be formed directly on dielectric layer 120 while dielectric layer 120 is over conductive layer 121, core layer 112, and buildup layers 114 and 115. The in-situ process for forming TFC 111 directly on substrate 104 may simplify fabrication process and reduce fabrication time.

In some embodiments, one or more of layers of package 100 may be omitted. For example, buildup layer 114 may be omitted such that such that TFC 111 may be formed directly on core layer 112.

FIG. 1 shows TFC 111 formed above core layer 112. In some embodiments, TFC 111 may be formed below core layer 112. For example, TFC 111 may be formed between core layer 112 and buildup layer 115. In some embodiments, besides TFC 111, one or more additional TFC may be formed and embedded in substrate 104.

FIG. 2 through FIG. 8 show various processes of forming a TFC according to an embodiment of the invention.

Figure 2:
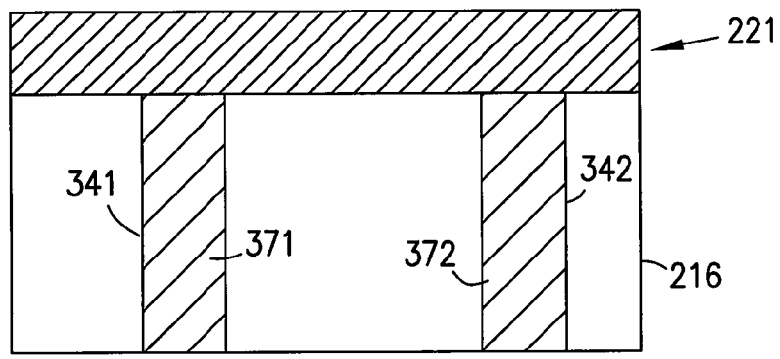
FIG. 2 through FIG. 8 show various processes of forming a TFC according to an embodiment of the invention.

FIG. 2 shows a substrate portion 216 with conductive segments 371 and 372, and a conductive layer 221. Substrate portion 216 may be a portion of a package substrate such as substrate 104 of package 100 of FIG. 1. Substrate portion 216 may include a buildup layer, or a core layer, or a combination of a core layer and at least one buildup layer of a package substrate. For example, using FIG. 1 as a reference, substrate portion 216 of FIG. 2 may include a buildup layer such as buildup layer 114, or a core layer such as core layer 112, or a combination of layers such as core layer 112 and at least one of the buildup layers 114 and 115.

In FIG. 2, substrate portion 216 may include an organic material. In some embodiments, substrate portion 216 may include at least one polymer layer. Conductive segments 371 and 372 of FIG. 2 may be formed before or after conductive layer 221 is formed. In some embodiments, conductive segments 371 and 372 are formed before conductive layer 221 is formed by forming vias 341 and 342 through substrate portion 216 and then filling vias 341 and 342 with a conductive material. In other embodiments, conductive segments 371 and 372 are formed after conductive layer 221 is formed by forming vias 341 and 342 through conductive layer 221 and substrate portion 216 and then filling vias 341 and 342 with a conductive material. The material for conductive segments 371 and 372 may be different from the conductive material for conductive layer 221. Vias 341 and 342 may be formed by drilling, or by other methods.

In some embodiments, conductive layer 221 may be formed by electro-plating. In other embodiments, conductive layer 221 may be formed by deposition of a conductive material on substrate portion 216. Conductive layer 221 may include a single conductive material or a compound of multiple materials. In some embodiments, conductive layer 221 may include copper or nickel. In other embodiments, conductive layer 221 may include other conductive materials. In some embodiments, conductive layer 221 has a thickness of about 15 micrometers. As shown in FIG. 2, conductive layer 221 is un-patterned such that it has no openings.

Figure 3:
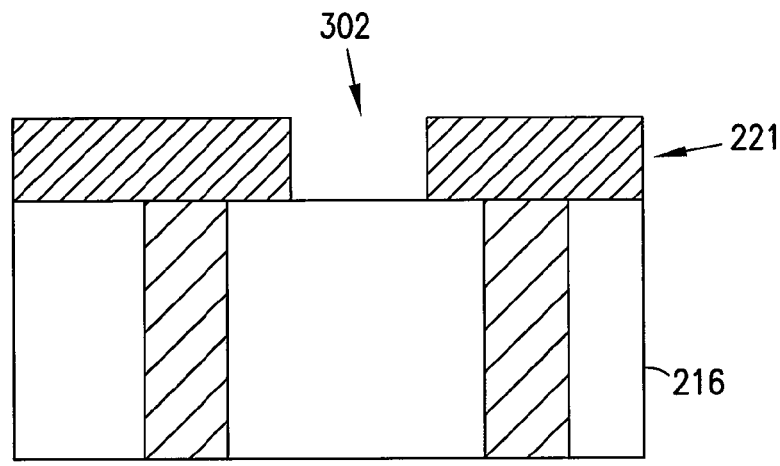

FIG. 3 shows a patterned conductive layer 221 such that it has an opening 302. As shown in FIG. 3, opening 302 exposes a portion of substrate portion 216. Opening 302 may be formed by patterning conductive layer 221 after conductive layer 221 is formed on substrate portion 216. In some embodiments, etching, laser drilling, or other methods may be used to pattern conductive layer 221 to form opening 302.

Figure 4:
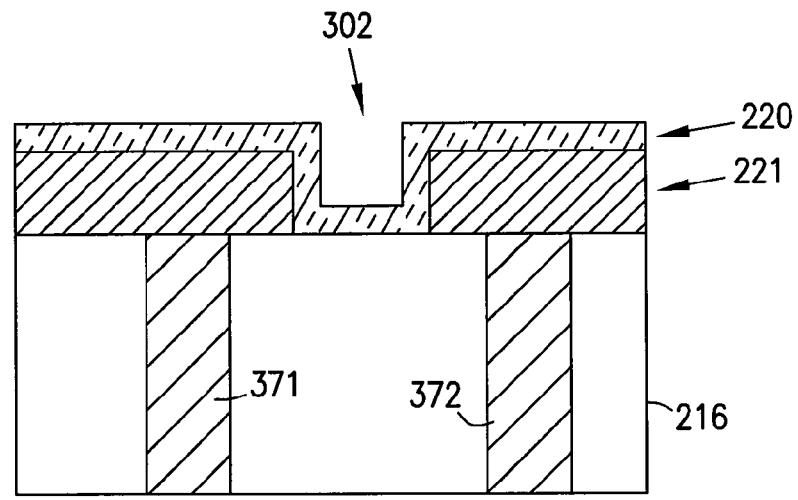

FIG. 4 shows a dielectric layer 220 formed on conductive layer 221. As shown in FIG. 4, a portion of dielectric layer 220 directly contacts substrate portion 216 at opening 302. Dielectric layer 220 may be formed by depositing a dielectric material directly on conductive layer 221. Some examples of techniques for forming dielectric layer 220 include sputtering, ion plating, plasma enhanced chemical vapor deposition (PECVD), plasma spray, thermal spray, printing, and aerosol. Other methods may be used. In some embodiments, the dielectric material for dielectric layer 220 may include a ceramic material. Some examples of materials for dielectric layer 220 include barium titanate $BaTiO_3$, strontium titanate $SrTiO_3$, and barium strontium titanate $BaSrTiO_3$. In some embodiments, dielectric layer 220 has a thickness of about one micrometer.

Dielectric layer 220 may be formed at a temperature such that thermal damage to layers underneath dielectric layer 220 may be avoided. In some embodiments, dielectric layer 220 may be formed at a temperature of about 200° C. In other embodiments, dielectric layer 220 may be formed at a temperature lower than 200° C. In some other embodiments, dielectric layer 220 may be formed at about room temperature, for example, at about 25° C.

In some embodiments, substrate portion 216 may have a low melting point such that thermal damage may happen to substrate portion 216 when dielectric layer 220 is formed at a temperature higher than 200° C. Therefore, in some embodiments, forming dielectric layer 220 at a temperature at about 200° C. or lower may prevent thermal damage to layers underneath dielectric layer 220. Further, the structure of FIG. 4 may assist in dissipating or transferring heat that is generated during a subsequent process to prevent thermal damage to substrate portion 216. For example, heat may be transferred to conductive layer 221 and conductive segments 371 and 372 during a process of annealing dielectric layer 220, thereby reducing the amount of generated heat that may affect substrate portion 216.

Figure 5:
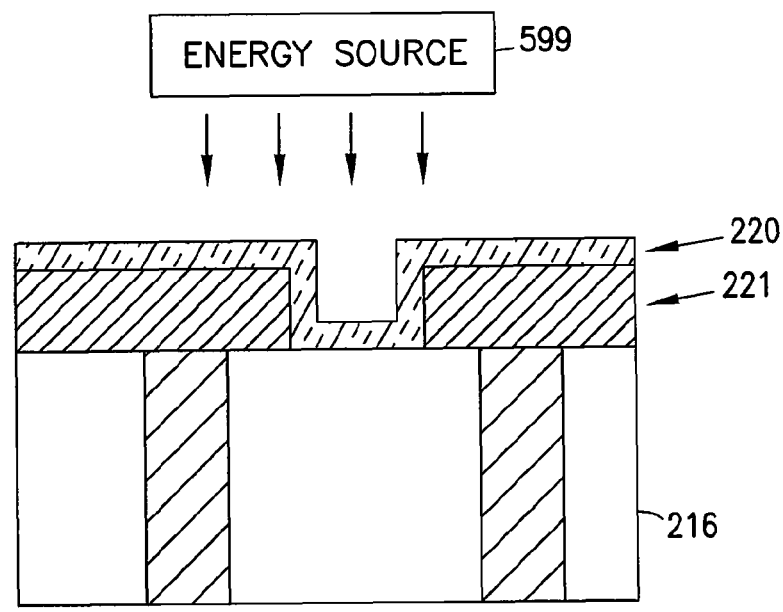

FIG. 5 shows dielectric layer 220 being annealed. An energy source 599 is used for annealing dielectric layer 220. Energy source 599 may provide an electromagnetic energy. In some embodiments, energy source 599 may provide microwave energy with a frequency of about 3 gigahertz to about 300 gigahertz.

In FIG. 5, annealing of dielectric layer 220 allows it to have a relatively high dielectric constant. In some embodiments, dielectric layer 220 may have a dielectric constant of about 400. In other embodiments, dielectric layer 220 may have a dielectric constant of about 6000. In some other embodiments, dielectric layer 220 may have a dielectric constant between about 400 and about 6000. In some embodiments, dielectric layer 220 may be formed by depositing a dielectric material at one temperature, then annealing the dielectric material at another temperature to form dielectric layer 220 with a dielectric constant between about 2000 and about 4000. In other embodiments, dielectric layer 220 may be formed by depositing a dielectric material at about room temperature in which the dielectric material may be amorphous and have a relatively low dielectric constant. The dielectric material is then annealed at temperature of about 200° C. or lower. For example, the dielectric material may be annealed at a temperature from about room temperature to about 200° C. to achieve dielectric layer 220 with a relatively high dielectric constant.

In some embodiments, dielectric layer 220 may be annealed in an oven with microwave irradiation directed to dielectric layer 220 during annealing. For example, a microwave with a frequency of about 28 gigahertz may be used to irradiate dielectric layer 220 during annealing. In some embodiments, dielectric layer 220 may be annealed for about one minute to about 60 minutes in an oven with microwave irradiation directed to dielectric layer 220 during annealing.

Without irradiation, a relatively high temperature (for example, higher than 200° C.) may be used to anneal dielectric layer 220 to achieve a relatively high dielectric constant (for example, from about 400 to about 6000) for dielectric layer 220, thereby thermal damage to substrate portion 216 may happen. With irradiation, such as microwave irradiation described herein, a relatively low temperature (for example, 200° C. or lower) may be used to anneal dielectric layer 220 to achieve a relatively high dielectric constant (for example, from about 400 to about 6000) for dielectric layer 220, thereby thermal damage to substrate portion 216 may be avoided.

Further, in some embodiments, since dielectric layer 220 may be annealed in an oven at with microwave irradiation, the heat generated from the annealing may be uniformly distributed within dielectric layer 220 and other layers. The uniformity of heat may reduce the chance of dielectric layer 220 and other layers from being cracked or thermally damaged. When dielectric layer 220 is annealed using other forms of electromagnetic energy (for example, a laser beam), non-uniformity of heat may happen to dielectric layer 220 and other layers. Therefore, the chance of dielectric layer 220 and other layers being cracked or thermally damaged may increase. Further, microwave irradiation may be relatively easier to control than other forms of electromagnetic energy such as a laser beam. Thus, using microwave irradiation during the annealing of dielectric layer 220 may improve the annealing process in comparison to annealing dielectric layer 220 using other forms of electromagnetic energy.

In some embodiments, since dielectric layer 220 may be annealed at the relatively low temperature and with microwave irradiation, dielectric layer 220 may exhibit a uniaxial grain microstructure. The uniaxial grain microstructure of dielectric layer 220, as described herein, may be determined with microscopic techniques such as scanning electron microscopy (SEM) or other techniques. In some cases, a dielectric layer such as dielectric layer 220 may exhibit a columnar (instead of uniaxial) grain microstructure when the dielectric layer is annealed at a relatively high temperature (for example, higher than 200° C.), or when the dielectric layer is annealed with electromagnetic energy higher than microwave energy, or when the dielectric layer is annealed with both high temperature and with electromagnetic energy higher than microwave energy. As shown in FIG. 5, dielectric layer 220 is un-patterned.

Figure 6:
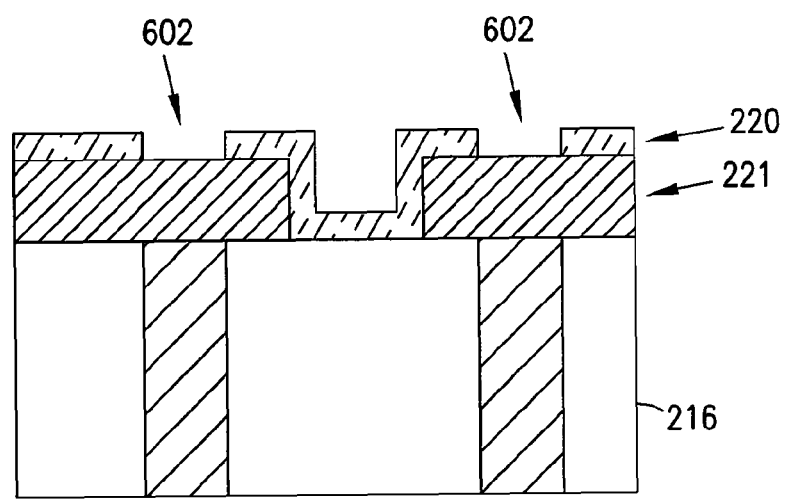

FIG. 6 shows a patterned dielectric layer 220 with openings 602. Openings 602 may be formed by patterning dielectric layer 220. In some embodiments, etching, laser drilling, or other methods may be used to pattern dielectric layer 220 to form openings 602. In FIG. 6, dielectric layer 220 is patterned after it is annealed. In some embodiments, dielectric layer 220 may be patterned before it is annealed. For example, dielectric layer 220 may be patterned in the process of described in FIG. 4, before dielectric layer 220 is annealed. Patterning dielectric layer 220 after dielectric layer 220 is annealed, as described in FIG. 6, may further protect substrate portion 216 when dielectric layer 220 is annealed.

Figure 7:
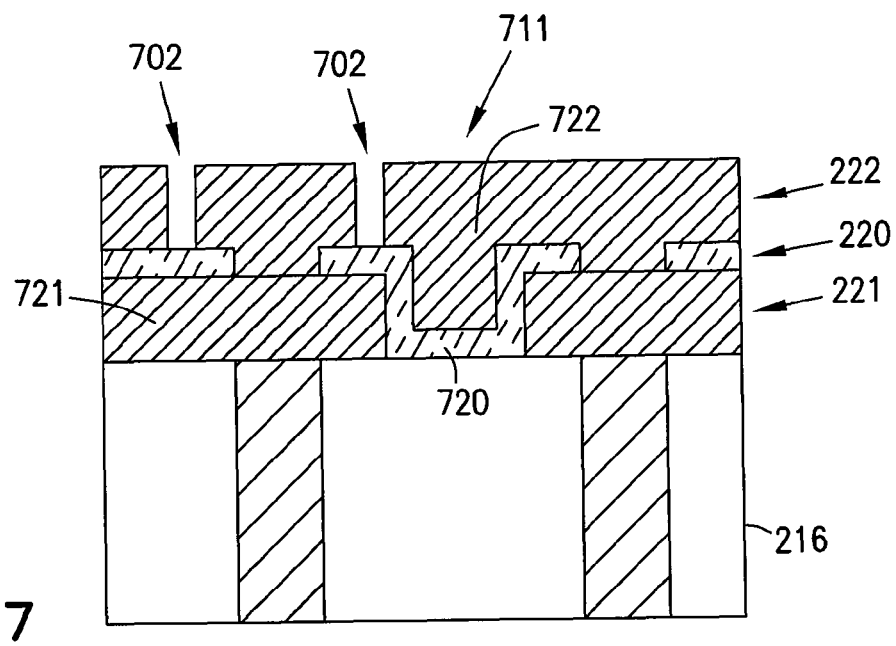

FIG. 7 shows a conductive layer 222 formed on dielectric layer 220. Conductive layer 222 is patterned to create openings or gaps 702. FIG. 7 also shows a structure of a TFC 711. The dielectric layer of TFC 711 includes portion 720 of the dielectric layer 220. The bottom capacitor electrode layer of TFC 711 includes portion 721 of conductive layer 221. The top capacitor electrode layer of TFC 711 includes portion 722 of conductive layer 222.

Figure 8:
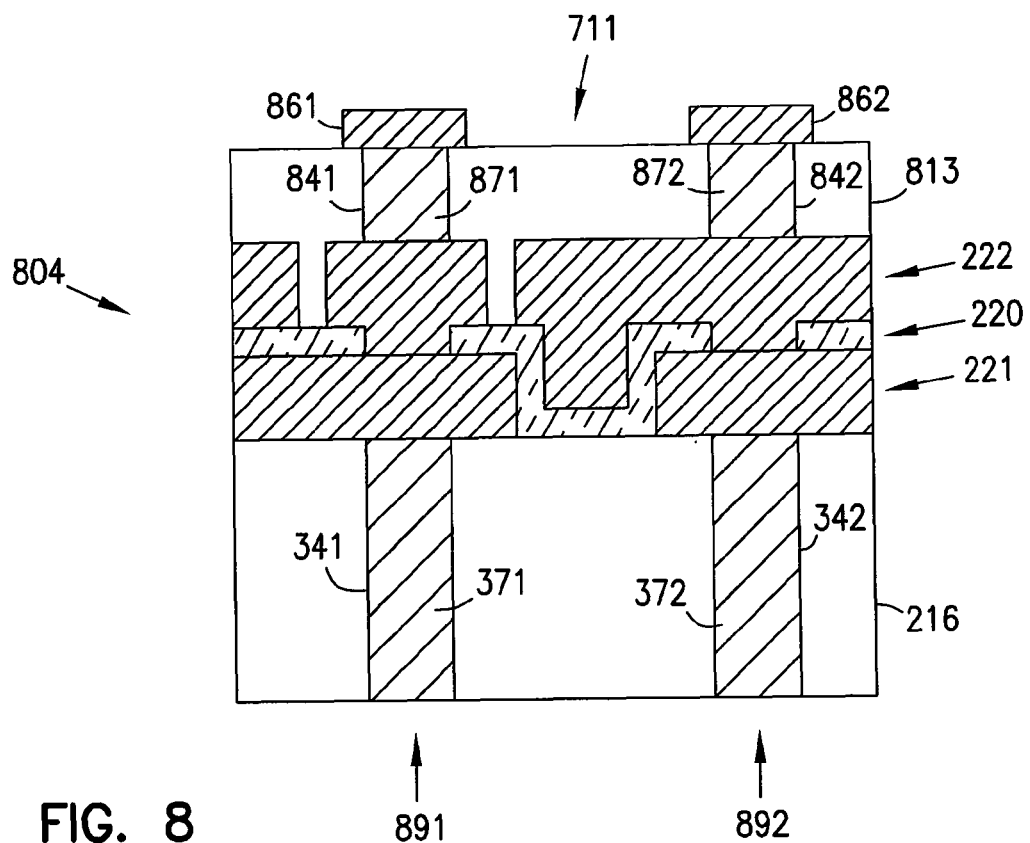

FIG. 8 shows a substrate portion 813, conductive segments 871 and 872, and conductive contacts or pads 861 and 862. Conductive segments 871 and 872 may be formed by forming and filling vias 841 and 842 with conductive material. In some embodiments, each of the conductive segments 371, 372, 871, 872, and conductive layers 221 and 222 may have a different material. As shown in FIG. 8, conductive segments 371 and 871 may be a part of a conductive path 891; conductive segments 372 and 872 may be a part of a conductive path 892. In some embodiments, conductive paths 891 and 892 of FIG. 8 may be a part of conductive paths such as conductive paths 191 and 192 of FIG. 1; conductive contacts 861 and 862 of FIG. 8 may be conductive contacts such as conductive contacts 161 and 162 of FIG. 1. The structure shown in FIG. 8 may be a part of a substrate 804. As described in FIG. 2 through FIG. 8, each of the conductive layers 221 and 222 and dielectric layer 220 of TFC 711 is individually and directly formed on substrate 804. In some embodiments, substrate 804 may be a package substrate such as substrate 104 of package 100 of FIG. 1.

The components of substrate 804 and TFC 711 in FIG. 8 are formed according to an example order, as described in FIG. 2 through FIG. 8. In some embodiments, the components of substrate 804 and TFC 711 may be formed in an order different from the order described herein. FIG. 2 through FIG. 8 show an example of forming a TFC such as TFC 711. Multiple thin film capacitors such as a multiple of TFC 711 of FIG. 8 may be formed in a process similar to that described in FIG. 2 through FIG. 8.

As described in FIG. 2 through FIG. 8, the entire TFC 711 is formed and embedded in substrate 804 (FIG. 8) by separately or individually forming each component of TFC 711 directly on substrate 804. Thus, according to some embodiments of the invention, a TFC such as TFC 711 is formed directly on and embedded in substrate 804 without a lamination process such that none of the portions or components of the TFC 711 is pre-formed and then laminated onto substrate 804.

Forming a TFC in a package such as forming TFC 111 or TFC 711 according to some embodiments of the invention may eliminate the need for the careful handling of the pre-formed capacitor, eliminate the involvement of an accurate alignment of the lamination process, and may reduce cost and fabrication time. Further, forming the capacitor in a package, such as forming TFC 111 or TFC 711 according to some embodiments of the invention, may allow for an easy formation of the vias. For example, the vias may be formed subsequently on the different layers as each layer is being formed.

Moreover, forming the capacitor in a package such as forming TFC 111 or TFC 711 according to the embodiments of the invention may allow for an in-situ process of forming the TFC on the substrate because the TFC does not have to be pre-formed in a separate process. The in-situ process of forming the TFC directly on the substrate may simplify fabrication process and reduce fabrication time.

FIG. 9 through FIG. 15 show various processes of forming a TFC according to another embodiment of the invention.

Figure 9:
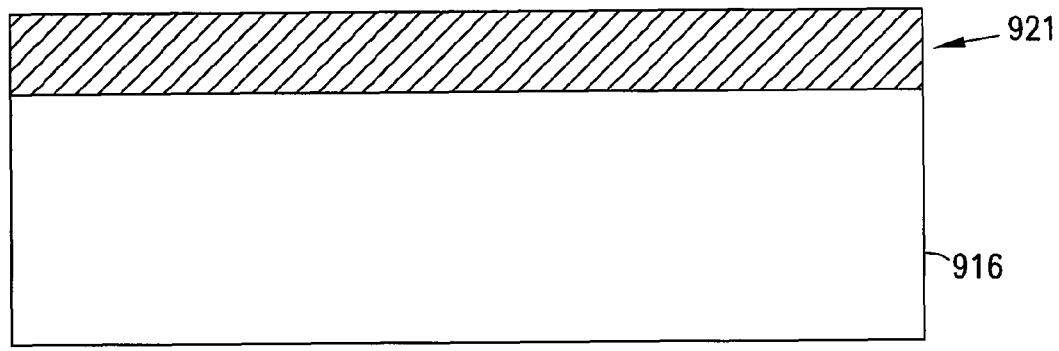
FIG. 9 through FIG. 15 show various processes of forming a TFC according to another embodiment of the invention.

FIG. 9 shows a substrate portion 916 and a conductive layer 921. Substrate portion 916 may include embodiments of substrate 104 of FIG. 1 and substrate portion 216 of FIG. 2. In FIG. 9, conductive layer 921 may be formed by electroplating or by other techniques. As shown in FIG. 9, conductive layer 921 is un-patterned such that it has no openings.

Figure 10:
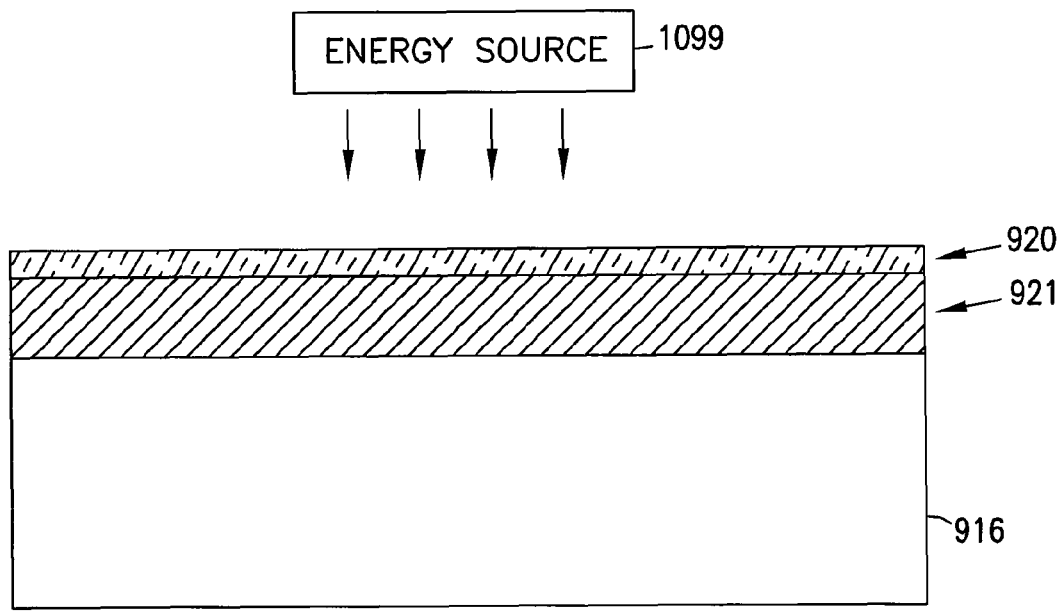

FIG. 10 shows a dielectric layer 920 formed on conductive layer 921. As shown in FIG. 10, conductive layer 921 is un-patterned when dielectric layer 920 is formed on conductive layer 921. In some embodiments, dielectric layer 920 may be formed by depositing a dielectric material on conductive layer 921, then annealing dielectric layer 920 in a process similar to the process used to form dielectric layer 220 as described in FIG. 2 through FIG. 8. For example, dielectric layer 920 may be annealed at a relatively low temperature with microwave energy from an energy source 1099.

Figure 11:
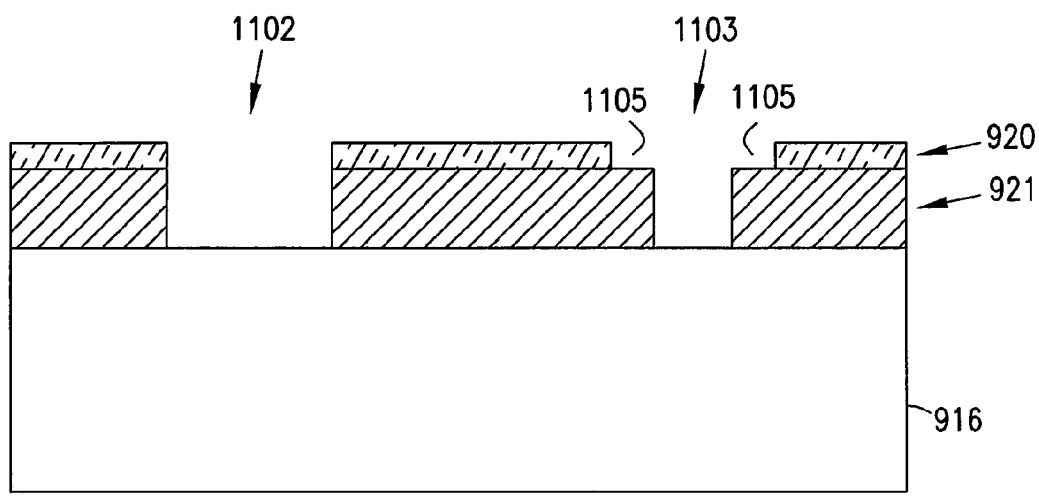

FIG. 11 shows a patterned conductive layer 921 and a patterned dielectric layer 920 with opening 1102 and 1103. Opening 1102 and 1103 may be formed in one or more steps. For example, a first step may form both openings 1102 and 1103, then a second step may form notches 1105 at only opening 1103.

Figure 12:
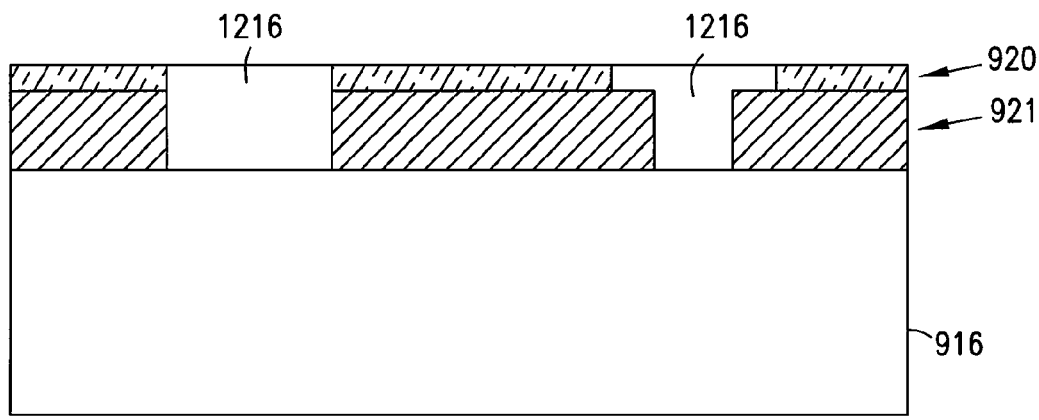

FIG. 12 shows a portion 1216 filled openings 1102 and 1103 of FIG. 11. Portion 1216 is electrically non-conductive. In some embodiments, portion 1216 may include a material similar to the material of substrate portion 916. In some embodiments, portion 1216 may be formed by depositing a non-conductive material on dielectric layer 920 and in openings 902 and 903, then removing some of the non-conductive material to obtain portion 1216 as shown in FIG. 12.

Figure 13:
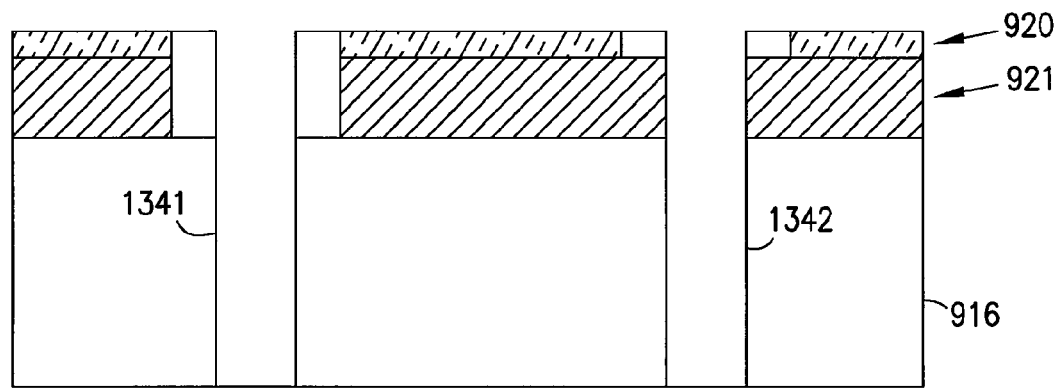

FIG. 13 shows vias 1341 and 1342 formed in substrate portion 916.

Figure 14:
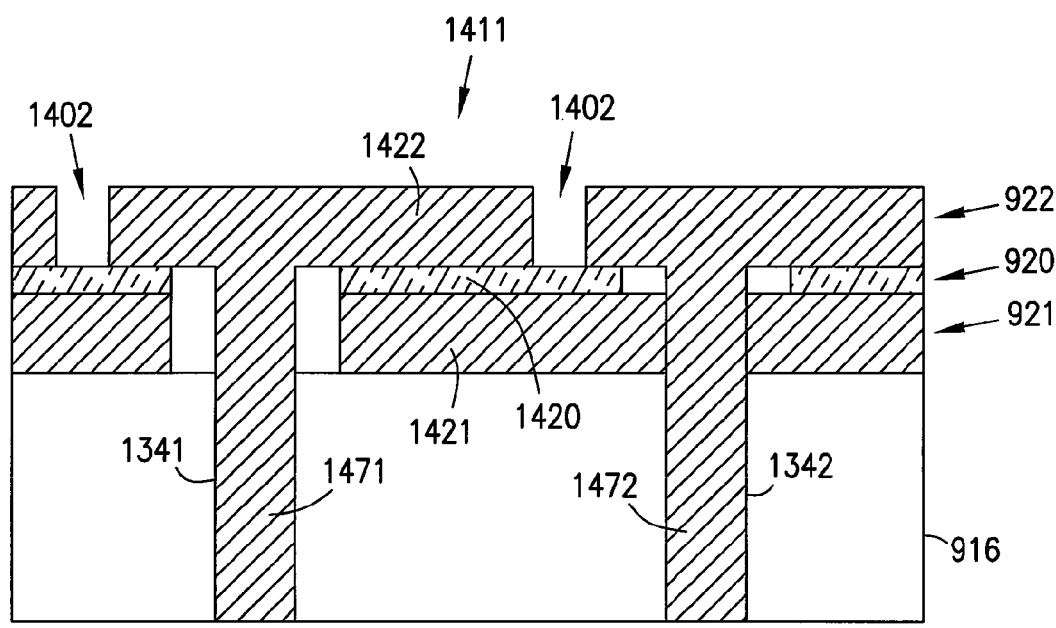

FIG. 14 shows a conductive layer 922 formed on dielectric layer 920 and filled vias 1341 and 1342. Conductive layer 922 is patterned to create openings 1402 and conductive segments 1471 and 1472. FIG. 14 also shows a structure of a TFC 1411. The dielectric layer of TFC 1411 includes portion 1420 of the dielectric layer 920. The bottom capacitor electrode layer of TFC 1411 includes portion 1421 of conductive layer 921. The top capacitor electrode layer of TFC 1411 includes portion 1422 of conductive layer 922.

Figure 15:
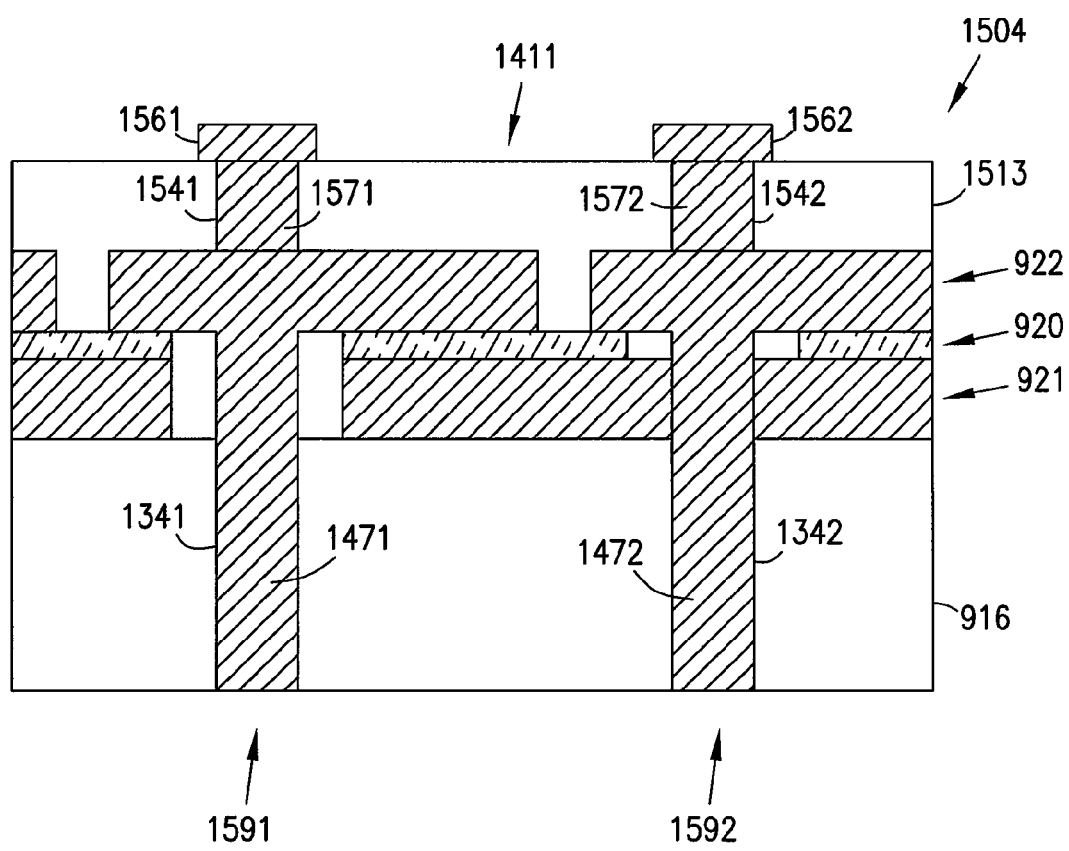

FIG. 15 shows a substrate portion 1513, conductive segments 1571 and 1572, and conductive contacts or pads 1561 and 1562. Conductive segments 1571 and 1572 may be formed by forming and filling vias 1541 and 1542 with conductive material. As shown in FIG. 15, conductive segments 1471 and 1571 may be a part of a conductive path 1591; conductive segments 1472 and 1572 may be a part of a conductive path 1592. In some embodiments, conductive paths 1591 and 1592 of FIG. 15 may be a part of conductive paths such as conductive paths 191 and 192 of FIG. 1; conductive contacts 1561 and 1562 of FIG. 15 may be conductive contacts such as conductive contacts 161 and 162 of FIG. 1. The structure shown in FIG. 15 may be a part of a substrate 1504.

In some embodiments, substrate 1504 may be a package substrate such as substrate 104 of package 100 of FIG. 1.

FIG. 16 through FIG. 22 show various processes of forming a TFC according to a further embodiment of the invention.

Figure 16:
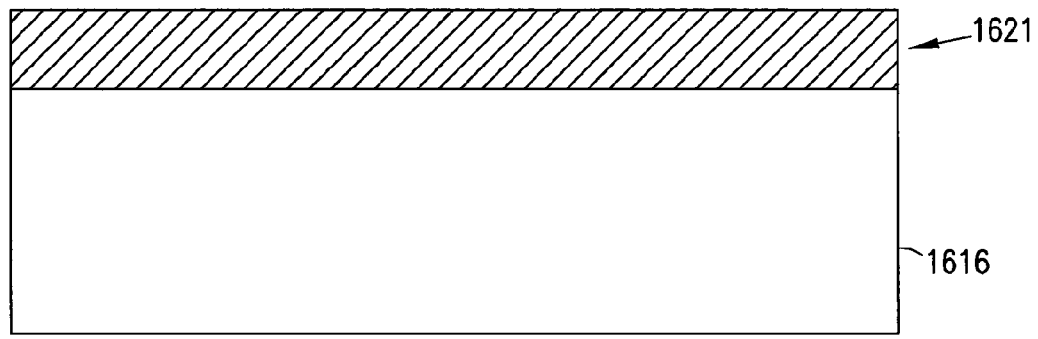
FIG. 16 through FIG. 22 show various processes of forming a TFC according to a further embodiment of the invention.

FIG. 16 shows a substrate portion 1616 and a conductive layer 1621. Substrate portion 1616 may include embodiments of substrate 104 of FIG. 1 and substrate portion 216 of FIG. 2. In FIG. 16, conductive layer 1621 may be formed by electroplating or by other techniques. As shown in FIG. 16, conductive layer 1621 is un-patterned.

Figure 17:
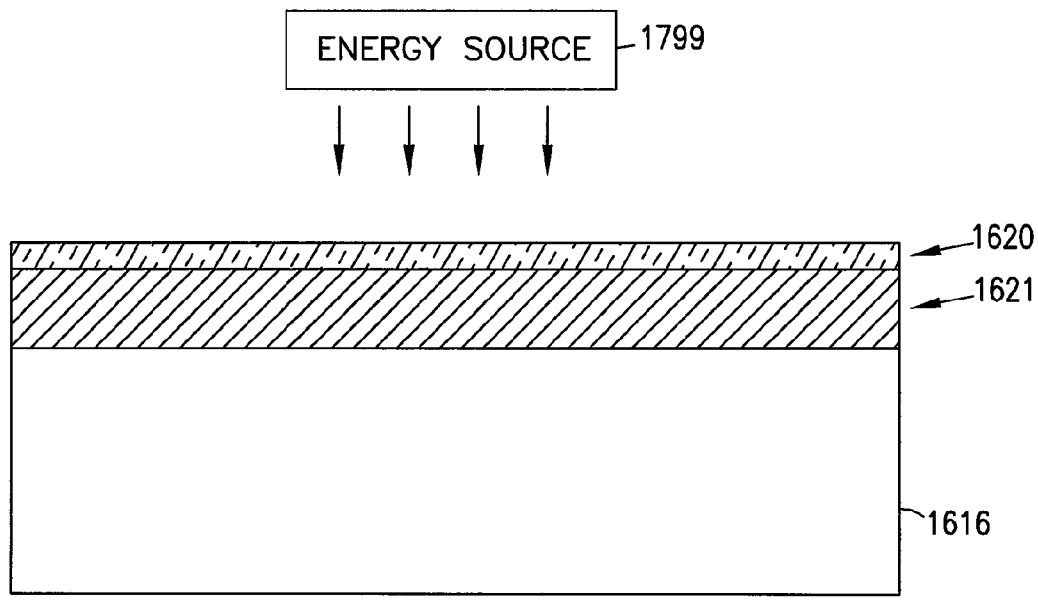

FIG. 17 shows a dielectric layer 1620 formed on conductive layer 1621. As shown in FIG. 17, conductive layer 1621 is un-patterned when dielectric layer 1620 is formed on conductive layer 1621. In some embodiments, dielectric layer 1620 may be formed by depositing a dielectric material on conductive layer 1621, then annealing dielectric layer 1620 in a process similar to the process used to form dielectric layers 220 and 920 as described in FIG. 2 through FIG. 15. For example, dielectric layer 1620 may be annealed at a relatively low temperature with microwave energy from an energy source 1799.

Figure 18:
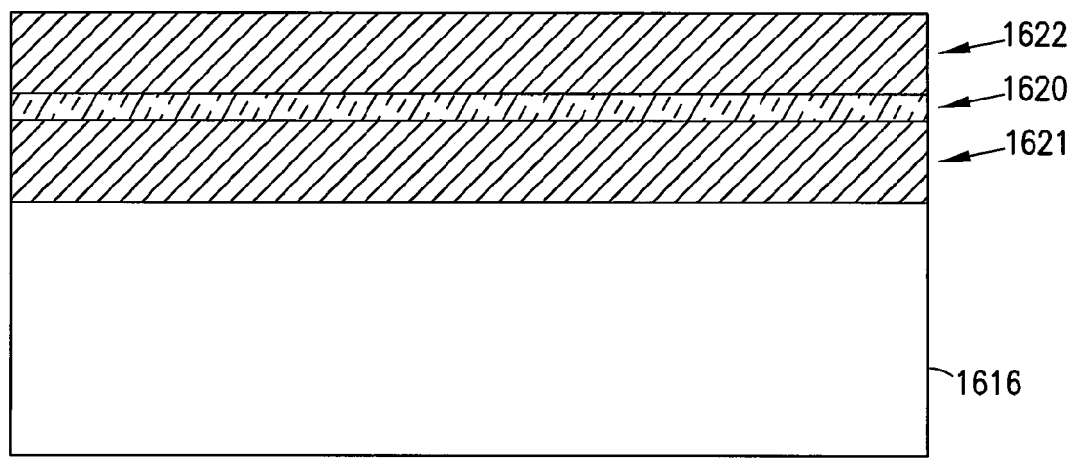

FIG. 18 shows a conductive layer 1622 formed on dielectric layer 1620. Conductive layer 1622 may be formed by electro-plating or by other techniques.

Figure 19:
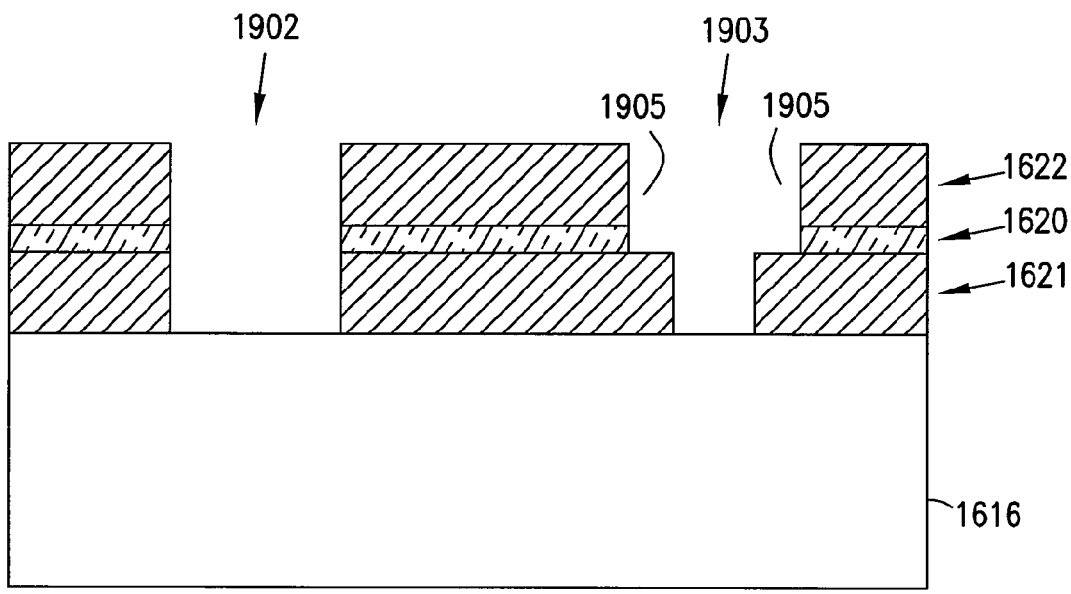

FIG. 19 shows a patterned conductive layer 1621, a patterned dielectric layer 1620, and a patterned conductive layer 1622 with openings 1902 and 1903. Opening 1902 and 1903 may be formed in one or more steps. For example, a first step may form both openings 1902 and 1903, then a second step may form notches 1905 at only opening 1903.

Figure 20:
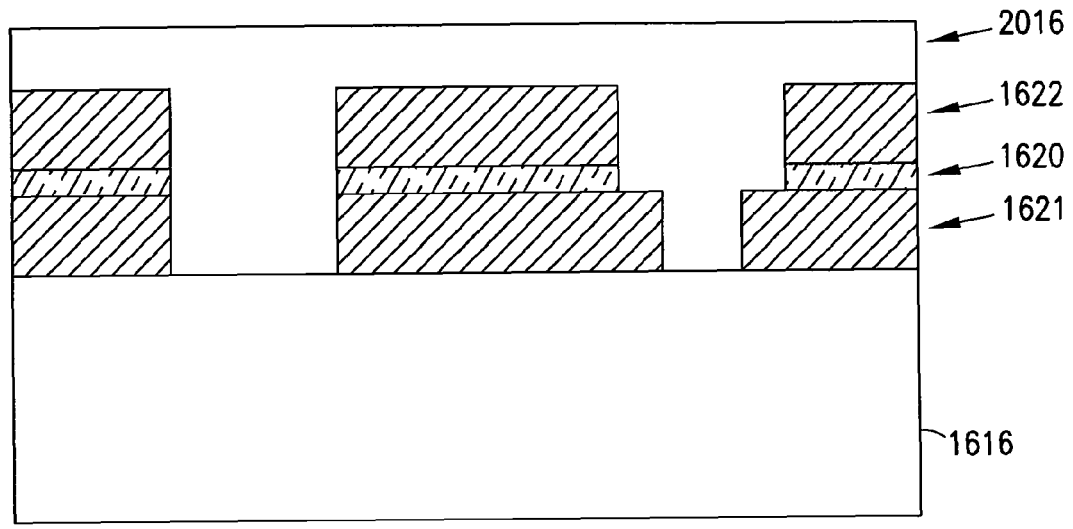

FIG. 20 shows a substrate portion 2016 formed on conductive layer 1622 and filled openings 1902 and 1903. Substrate portion 2016 is electrically non-conductive. In some embodiments, substrate portion 2016 may include a material similar to the material of substrate portion 1616.

Figure 21:
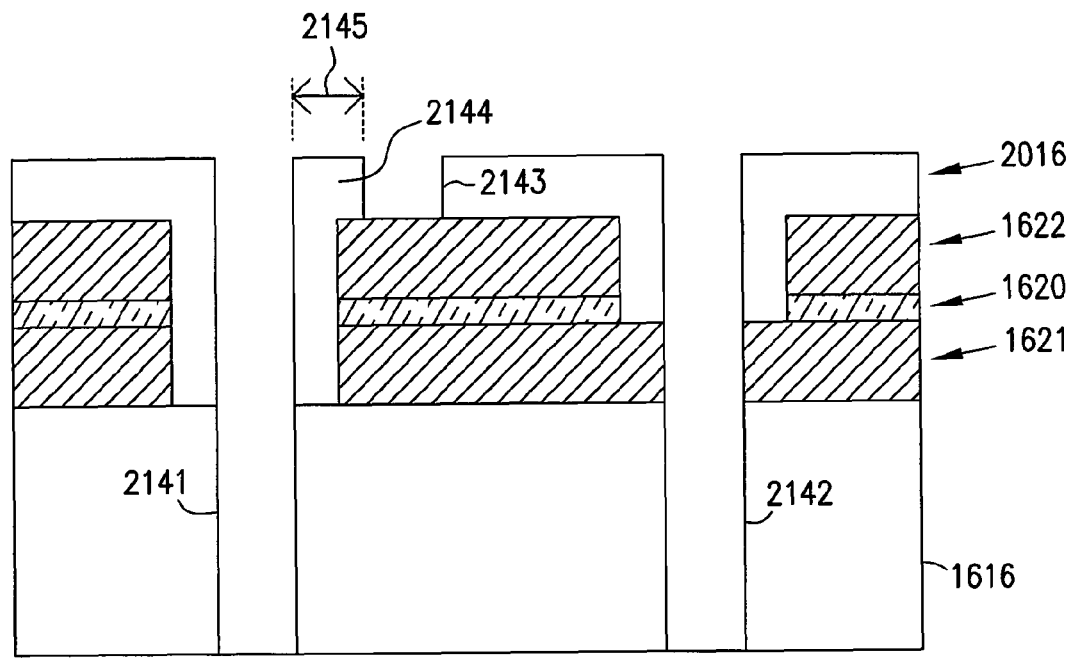

FIG. 21 shows vias 2141, 2142, and 2143 formed in substrate portions 2016 and 1616. In some embodiments, vias 2141, 2142, and 2143 may be formed in one or more steps. As shown in FIG. 21, via 2143 and via 2141 are separated by a portion 2144 of substrate portion 2016 such that 2143 and via 2141 are offset (not aligned) from each other by an offset 2145.

Figure 22:
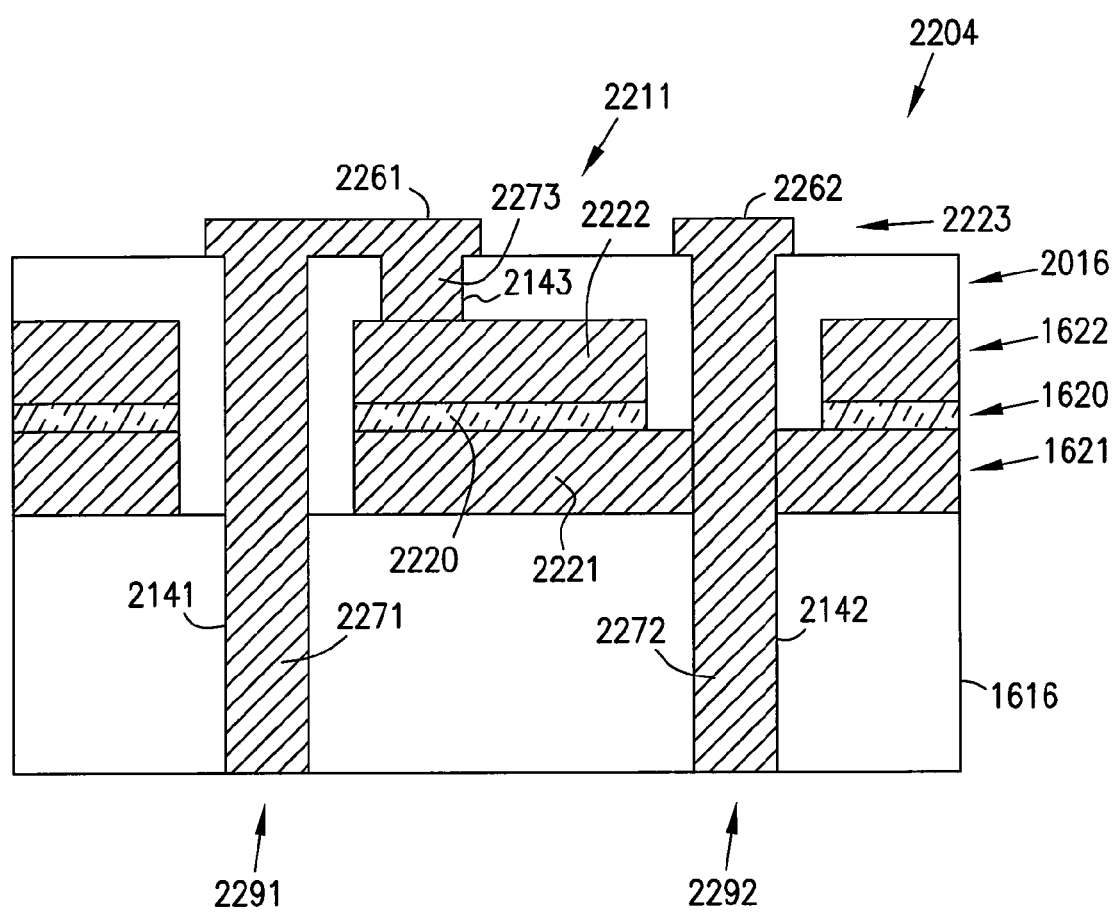

FIG. 22 shows a conductive portion 2223 formed on substrate portion 1616 and filled vias 2141, 2142, and 2143. Conductive portion 2223 is patterned to create conductive contacts 2261 and 2262 and conductive segments 2271, 2272, and 2273. FIG. 22 also shows a structure of a TFC 2211. The dielectric layer of TFC 2211 includes portion 2220 of the dielectric layer 1620. The bottom capacitor electrode layer of TFC 2211 includes portion 2221 of conductive layer 1621. The top capacitor electrode layer of TFC 2211 includes portion 2222 of conductive layer 1622. As shown in FIG. 22, the top capacitor electrode layer of TFC 2211 (portion 2222) is coupled to contact 2261 through conductive segment 2273 and may be coupled to another contact of substrate 2204 (such as contact 181 of FIG. 1) through conductive segment 2271. Conductive segment 2271 may be a part of a conductive path 2291; conductive segment 2272 may be a part of a conductive path 2292. In some embodiments, conductive paths 2291 and 2292 of FIG. 22 may be a part of conductive paths such as conductive paths 191 and 192 of FIG. 1; conductive contacts 2261 and 2262 of FIG. 22 may be conductive contacts such as conductive contacts 161 and 162 of FIG. 1. The structure shown in FIG. 22 may be a part of a substrate 2204. In some embodiments, substrate 2204 may be a package substrate such as substrate 104 of package 100 of FIG. 1.

Figure 23:
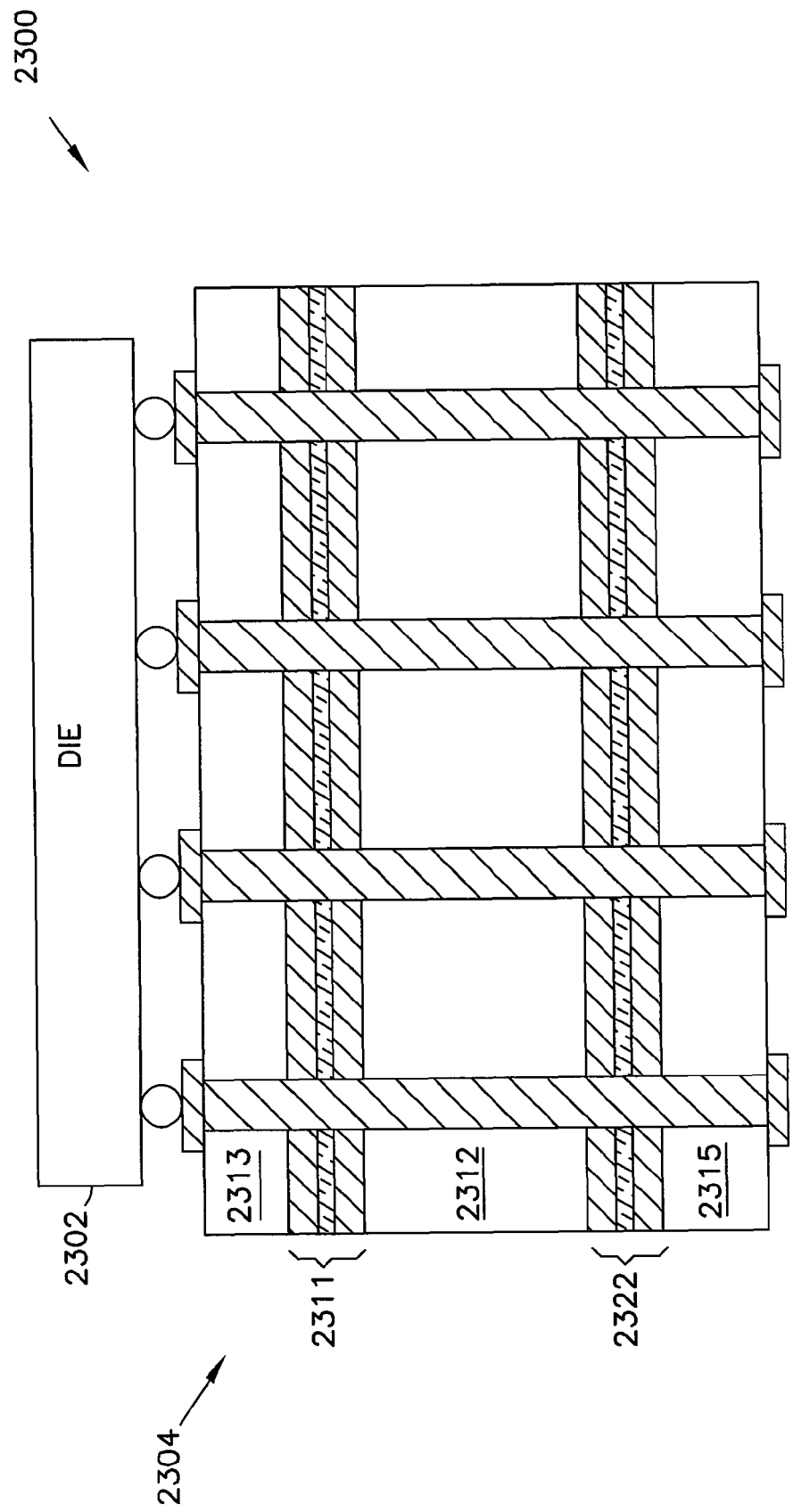
FIG. 23 shows a package having thin film capacitors formed on both sides of a substrate portion of a substrate according to an embodiment of the invention.

FIG. 23 shows a package having an integrated TFC formed on both sides of a substrate portion of a substrate according to an embodiment of the invention. Package 2300 includes a die 2302 attached to a substrate 2304. Substrate 2304 includes substrate portions 2312, 2313, and 2315, a TFC 2311 formed on one side of substrate portion 2312, and a TFC 2322 formed on another side of substrate portion 2312. Each of the substrate portions 2312, 2313, and 2315 may include one or more organic layers. Each of the TFC 2311 and TFC 2322 may represent either a single thin film capacitor or a group of multiple thin film capacitors. As shown in FIG. 23, both TFC 2311 and TFC 2322 are embedded in substrate 2304. In some embodiments, TFC 2311 and TFC 2322 may be formed in a process similar to the process described in FIG. 2 through FIG. 22.

Figure 24:
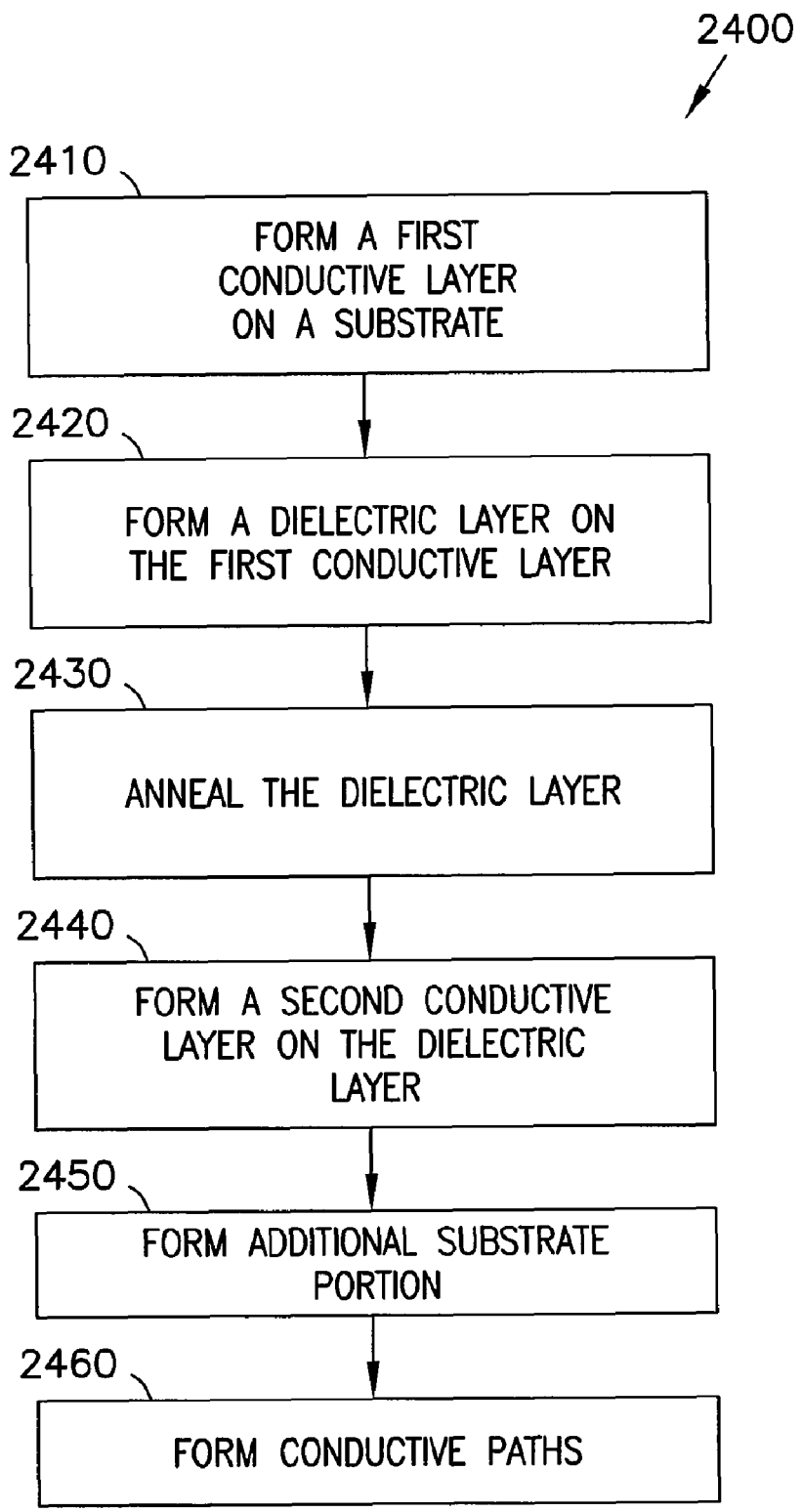
FIG. 24 is a flowchart showing a method according to an embodiment of the invention.

FIG. 24 is a flowchart of a method according to an embodiment of the invention. Method 2400 forms an integrated TFC directly on a substrate without pre-forming an entire TFC and then laminating the entire pre-formed TFC onto the substrate. Method 2400 forms each component of the TFC individually and directly on the substrate in an in-situ process. In method 2400 of FIG. 24, activity 2410 forms a first conductive layer on a substrate of a package. Activity 2420 forms a dielectric layer on the first conductive layer. Activity 2430 anneals the dielectric layer. Activity 2440 forms a second conductive layer on the dielectric layer. Activity 2450 forms an additional substrate portion on the second conductive layer. Activity 2460 forms a number of conductive paths to allow connections to the first and second conductive layers. Method 2400 may include the embodiments of forming the TFC such as TFC 111, TFC 711, TFC 1411, TFC 2211, TFC 2311, and TFC 2322 of FIG. 1 through FIG. 23.

The individual activities of method 2400 do not have to be performed in the order shown or in any particular order. Some activities may be repeated, and others may occur only once. Various embodiments of the invention may have more or fewer activities than those shown in FIG. 24.

Figure 25:
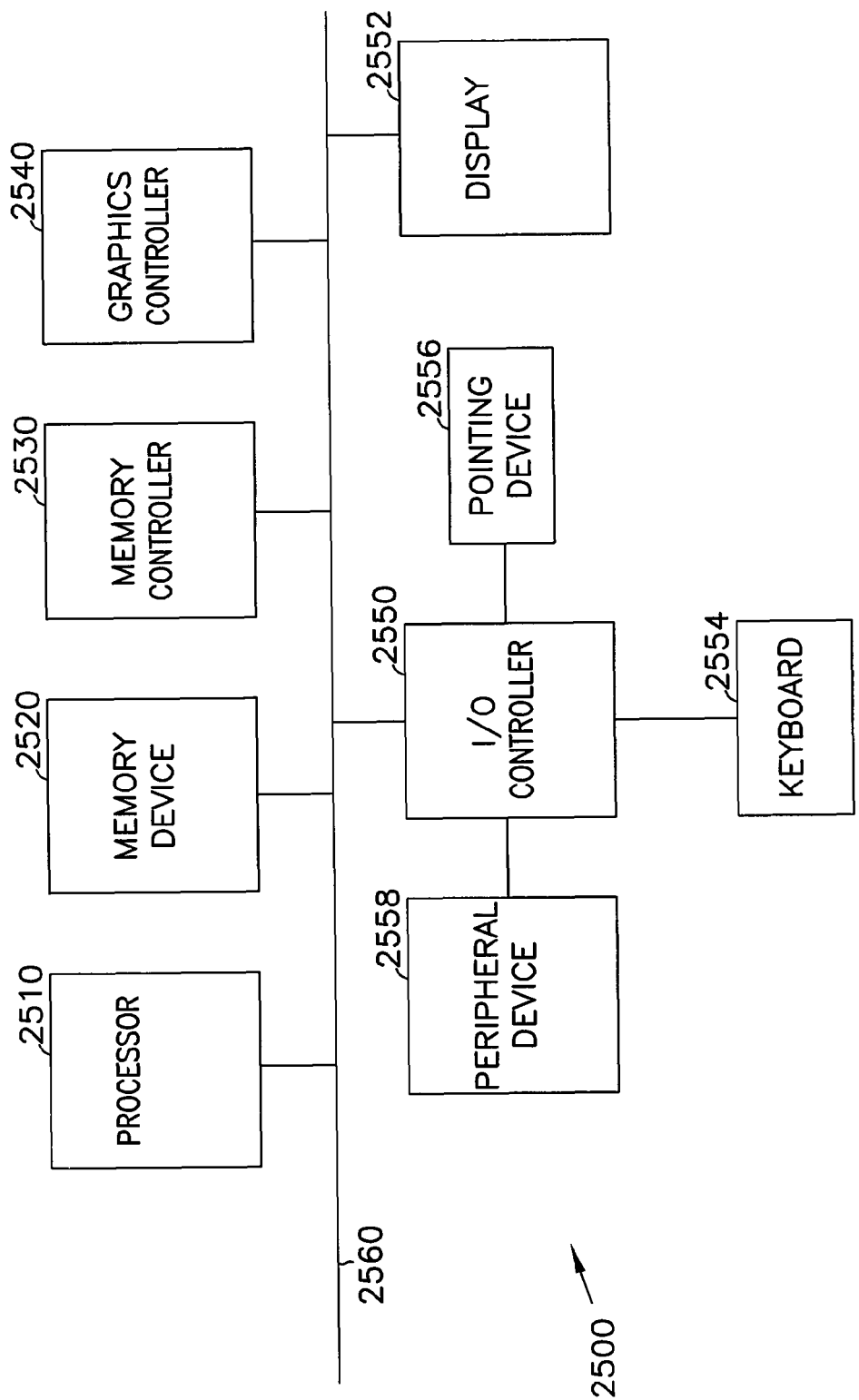
FIG. 25 shows a system according to an embodiment of the invention.

FIG. 25 shows a system according an embodiment of the invention. System 2500 includes a processor 2510, a memory device 2520, a memory controller 2530, a graphics controller 2540, an input and output (I/O) controller 2550, a display 2552, a keyboard 2554, a pointing device 2556, a peripheral device 2558, and a bus 2560.

Processor 2510 may be a general purpose processor or an application specific integrated circuit (ASIC). Memory device 2520 may be a dynamic random access memory (DRAM) device, a static random access memory (SRAM) device, a flash memory device, or a combination of these memory devices. I/O controller 2550 may include a communication module for wired or wireless communication.

One or more or the components shown in system 2500 may be included in one or more integrated circuit packages. For example, processor 2510, or memory device 2520, or at least a portion of I/O controller 2550, or a combination of these components may be included in an integrated circuit package such as package 100 of FIG. 1. Thus, one or more or the components shown in system 2500 may be included in a package, in which the package includes at least one thin film capacitor embedded in a package substrate such as TFC 111, TFC 711, TFC 1411, TFC 2211, TFC 2311, and TFC 2322 of FIG. 1 through FIG. 23.

System 2500 may include computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

The above description and the drawings illustrate some specific embodiments of the invention sufficiently to enable those skilled in the art to practice the embodiments of the invention. Other embodiments may incorporate structural, logical, electrical, process, and other changes. In the drawings, like features or like numerals describe substantially similar features throughout the several views. Examples merely typify possible variations. Portions and features of some embodiments may be included in, or substituted for, those of others. Many other embodiments will be apparent to those of skill in the art upon reading and understanding the above description. Therefore, the scope of various embodiments of the invention is determined by the appended claims, along with the full range of equivalents to which such claims are entitled.

What is claimed is:

1. An apparatus comprising:
an organic substrate;
a first capacitor electrode layer overlaying the organic substrate, the first capacitor electrode layer including a surface;
a dielectric layer overlaying the first capacitor electrode layer, wherein the dielectric layer exhibits a uniaxial grain microstructure; and
a second capacitor electrode layer overlaying the dielectric layer, wherein the second capacitor electrode layer includes a portion located below the surface of the first capacitor electrode layer.

2. The apparatus of claim 1, wherein the organic substrate portion includes a polymer layer.

3. The apparatus of claim 2, wherein the dielectric layer has a thickness of about one micrometer.

4. The apparatus of claim 3, wherein the dielectric material includes titanium.

5. The apparatus of claim 1, wherein at least a portion of the dielectric layer directly contacts the organic substrate.

6. The apparatus of claim 1, wherein the second capacitor electrode layer is coupled to a first contact of the organic substrate through a first conductive segment, wherein the second capacitor electrode layer is coupled to a second contact of the organic substrate through a second conductive segment, wherein the first and second conductive segments are separated by a portion of the organic substrate.

7. The apparatus of claim 6, wherein at least a portion of the first conductive segment is formed in a first via, and wherein at least a portion of the second conductive segment is formed in a second via.

8. The apparatus of claim 1 further comprising:
a first conductive path extending through a first opening of the dielectric layer, the first conductive path being coupled to the first capacitor electrode layer; and
a second conductive path extending through a second opening of the dielectric layer, the second conductive path being coupled to the second capacitor electrode layer.

9. The apparatus of claim 8, wherein the at least a portion of the first conductive path extends through the organic substrate, and wherein the at least a portion of the second conductive path extends through the organic substrate.

10. The apparatus of claim 1 further comprising a die attached to the organic substrate, wherein the die and the organic substrate are parts of an integrated circuit package.

11. A system comprising:
an integrated circuit package including:
   an organic substrate;
   a first capacitor electrode layer overlaying the organic substrate, the first capacitor electrode layer including a surface;
   a dielectric layer overlaying the first capacitor electrode layer, wherein the dielectric layer exhibits a uniaxial grain microstructure; and
      a second capacitor electrode layer overlaying the dielectric layer; an integrated circuit coupled to the organic substrate, wherein the second capacitor electrode layer includes a portion located below the surface of the first capacitor electrode layer; and
   a dynamic random access memory device coupled to the integrated circuit.

12. The system of claim 11 further comprising:
a first conductive path extending through a first opening of the dielectric layer, the first conductive path being coupled to the first capacitor electrode layer; and
a second conductive path extending through a second opening of the dielectric layer, the second conductive path being coupled to the second capacitor electrode layer.

13. The system of claim 12, wherein the at least a portion of the first conductive path extends through the organic substrate, and wherein the at least a portion of the second conductive path extends through the organic substrate.

* * * * *